(12) United States Patent
Bruch

(10) Patent No.: US 8,191,033 B1
(45) Date of Patent: May 29, 2012

(54) IN SITU CLOCK JITTER MEASUREMENT

(75) Inventor: Thomas Page Bruch, Corvallis, OR (US)

(73) Assignee: Marvell International Ltd., Hamilton (BM)

( * ) Notice: Subject to any disclaimer, the term of this patent is extended or adjusted under 35 U.S.C. 154(b) by 284 days.

(21) Appl. No.: 12/614,043

(22) Filed: Nov. 6, 2009

Related U.S. Application Data

(60) Provisional application No. 61/116,502, filed on Nov. 20, 2008.

(51) Int. Cl.
- *G06F 17/50* (2006.01)
- *G06F 11/00* (2006.01)
- *H03K 19/013* (2006.01)
- *H03K 17/16* (2006.01)
- *H01L 25/00* (2006.01)
- *G01R 31/08* (2006.01)
- *G01R 35/00* (2006.01)
- *H04L 1/00* (2006.01)
- *H04B 1/56* (2006.01)

(52) U.S. Cl. .......... 716/136; 716/113; 716/134; 703/16; 326/31; 326/28; 326/41; 326/47; 326/101; 326/93; 370/245; 370/253; 370/464; 370/516; 714/18; 714/21; 714/55; 714/57; 714/715; 714/746; 714/750; 702/89; 702/107; 702/122; 702/125

(58) Field of Classification Search .................. 716/113, 716/134, 136; 703/16; 326/31, 28, 41, 47, 326/101, 93; 370/245, 253, 465, 516; 714/18, 714/21, 55, 57, 700, 712, 715, 746, 750; 702/89, 107, 122, 125

See application file for complete search history.

(56) References Cited

U.S. PATENT DOCUMENTS

| | | | | |
|---|---|---|---|---|
| 5,309,428 | A * | 5/1994 | Copley et al. | 370/245 |
| 5,363,366 | A * | 11/1994 | Wisdom et al. | 370/245 |
| 6,269,330 | B1 * | 7/2001 | Cidon et al. | 714/43 |
| 6,507,934 | B1 * | 1/2003 | Smith | 716/113 |
| 6,687,857 | B1 * | 2/2004 | Iwata et al. | 714/38.13 |
| 6,975,655 | B2 * | 12/2005 | Fischer et al. | 370/516 |
| 7,185,252 | B2 * | 2/2007 | Choi | 714/732 |
| 7,260,493 | B2 * | 8/2007 | Laquai et al. | 702/117 |
| 7,272,534 | B2 * | 9/2007 | Bleakley | 702/185 |
| 7,386,041 | B2 * | 6/2008 | Nygaard, Jr. | 375/224 |
| 8,065,571 | B2 * | 11/2011 | Dickens et al. | 714/715 |
| 8,069,025 | B2 * | 11/2011 | Yoshida | 703/14 |
| 2002/0163932 | A1 * | 11/2002 | Fischer et al. | 370/465 |
| 2003/0063662 | A1 * | 4/2003 | Uchino et al. | 375/226 |
| 2005/0066297 | A1 * | 3/2005 | Kalafala et al. | 716/6 |
| 2005/0149779 | A1 * | 7/2005 | Bleakley | 714/700 |

(Continued)

OTHER PUBLICATIONS

Piqueira et al., "Analyzing the Effect of the Phase-Jitter in the Operation of Second Order Phase-Locked Loops", IEEE Transactions on Circuits and Systems-II: Express Briefs, vol. 52, No. 6, Jun. 2005, pp. 331-335.*

*Primary Examiner* — Phallaka Kik

(57) ABSTRACT

Embodiments of the present invention provide a method/apparatus to measure the jitter of a timing signal used in an integrated circuit chip. The method/apparatus is used to send data from a launch element using a synchronous data path of the timing signal, receive the data at a capture element using the synchronous data path, wherein the launch element and the capture element are disposed on the same integrated circuit chip upon which the timing signal is generated and/or used, and gather statistics about whether a timing violation has occurred by comparing the sent data with the received data over the course of multiple launch/capture events as the timing is adjusted. Other embodiments may be described and/or claimed.

20 Claims, 4 Drawing Sheets

U.S. PATENT DOCUMENTS

| | | | |
|---|---|---|---|
| 2006/0239204 A1* | 10/2006 | Bordonaro et al. | 370/253 |
| 2006/0247881 A1* | 11/2006 | Laquai et al. | 702/117 |
| 2007/0028154 A1* | 2/2007 | Lee | 714/712 |
| 2007/0140398 A1* | 6/2007 | Inoue et al. | 375/372 |
| 2007/0286322 A1* | 12/2007 | Uchino et al. | 375/376 |
| 2008/0129362 A1* | 6/2008 | Kawai | 327/292 |
| 2008/0301603 A1* | 12/2008 | Ja et al. | 716/5 |
| 2009/0157376 A1* | 6/2009 | Hollis | 703/16 |
| 2009/0241078 A1* | 9/2009 | Hemmett et al. | 716/6 |
| 2011/0231143 A1* | 9/2011 | LaBerge | 702/125 |

* cited by examiner

IN SITU CLOCK JITTER MEASUREMENT

CROSS REFERENCE TO RELATED APPLICATIONS

The present application claims priority to U.S. Provisional Patent Application No. 61/116,502, filed Nov. 20, 2008, the specification of which is hereby incorporated by reference in its entirety for all purposes, except for those sections, if any, that are inconsistent with this specification.

TECHNICAL FIELD

Embodiments of the present invention relate to the field of integrated circuits, and more particularly, to methods and configurations for on-chip measurement of clock jitter.

BACKGROUND

As operating frequencies of integrated circuit (IC) chips increase, clock uncertainty, such as, for example, clock jitter, becomes an increasingly significant part of a timing budget for clocks associated with such chips. However, accurately quantifying clock jitter by simulation or off-chip measurement can be difficult.

Many high-frequency clocks, for example, are synthesized on-chip by a phase locked loop (PLL), the output of which can be divided down to lower frequencies. Each clock of the chip can be distributed to on-chip clock users such as flip-flops or latches via a clock tree that includes a network of wires and buffers. The mixed-signal, high-frequency nature of the PLL and the distributed sources of clock jitter in the clock tree such as cross-talk and power supply noise are difficult to model for simulation.

Bringing the clock off-chip for measurement can involve sending a generated clock signal through an output driver and printed circuit board traces or other similar components for observation by an oscilloscope or other instrument for measuring jitter. Off-chip techniques can further include dividing the clock frequency to lower frequencies to accommodate limitations of the output driver. Thus, an off-chip measurement path typically includes additional equipment and other sources of timing jitter that can introduce significant timing uncertainty to measured clock jitter, which can lead to inaccurate results.

A simulation or off-chip measurement that provides a jitter estimate that is greater than the actual jitter can lead to unnecessary limitation of the operating frequency of an IC chip, which can reduce performance speed of an chip. Jitter estimates that are lower than the actual jitter can lead to timing errors that result in poor reliability or yields of an IC chip and/or missed manufacturing schedules and budgets due to expensive and time-consuming revisions of mask sets used to fabricate the IC chip.

SUMMARY

In various embodiments, the present disclosure provides a method that includes sending data from a launch element using a synchronous data path of a timing signal, receiving the data at a capture element using the synchronous data path, wherein the launch element and the capture element are disposed on an integrated circuit chip, and determining whether a timing violation has occurred due to jitter associated with the timing signal by comparing the sent data with the received data.

In various embodiments, the present disclosure further provides an apparatus having a launch element to send data in accordance with a timing signal, the data being sent through a synchronous data path, a capture element coupled to receive the data sent by the launch element, wherein the launch element and the capture element are disposed on an integrated circuit chip, a programmable delay to adjust timing of the synchronous data path to provide a number of different timing settings for the data that is respectively sent and received by the launch element and the capture element, and a controller to cause the launch element to send the data through the synchronous data path, and determine whether a timing violation has occurred due to jitter associated with the timing signal by comparing the data received by the capture element with the data sent by the launch element for each of the number of different timing settings.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION

The present specification describes configurations and techniques for measuring clock jitter in situ. In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

The following detailed description may include perspective-based descriptions such as up/down, back/front, left/right, and top/bottom. Such descriptions are merely used to facilitate the discussion and are not intended to restrict the application of embodiments of the present invention.

For the purposes of the present invention, the phrase "A/B" means A or B. For the purposes of the present invention, the phrase "A and/or B" means "(A), (B), or (A and B)." For the purposes of the present invention, the phrase "at least one of A, B, and C" means "(A), (B), (C), (A and B), (A and C), (B and C), or (A, B and C)."

The detailed description further includes use of the phrases "in an embodiment," or "in embodiments," which phrases may each refer to one or more of the same or different embodiments. Furthermore, the terms "comprising," "including," "having," and the like, as used with respect to embodiments of the present invention, are synonymous.

Various operations are described as multiple discrete actions or operations in turn, in a manner that is most helpful in understanding the claimed subject matter. However, the order of description should not be construed as to imply that these operations are necessarily order dependent. In particular, operations described herein may be performed in a different order (or concurrently) and still achieve desirable results. Various additional operations may be performed and/or described operations may be omitted in additional embodiments.

Figure 1:
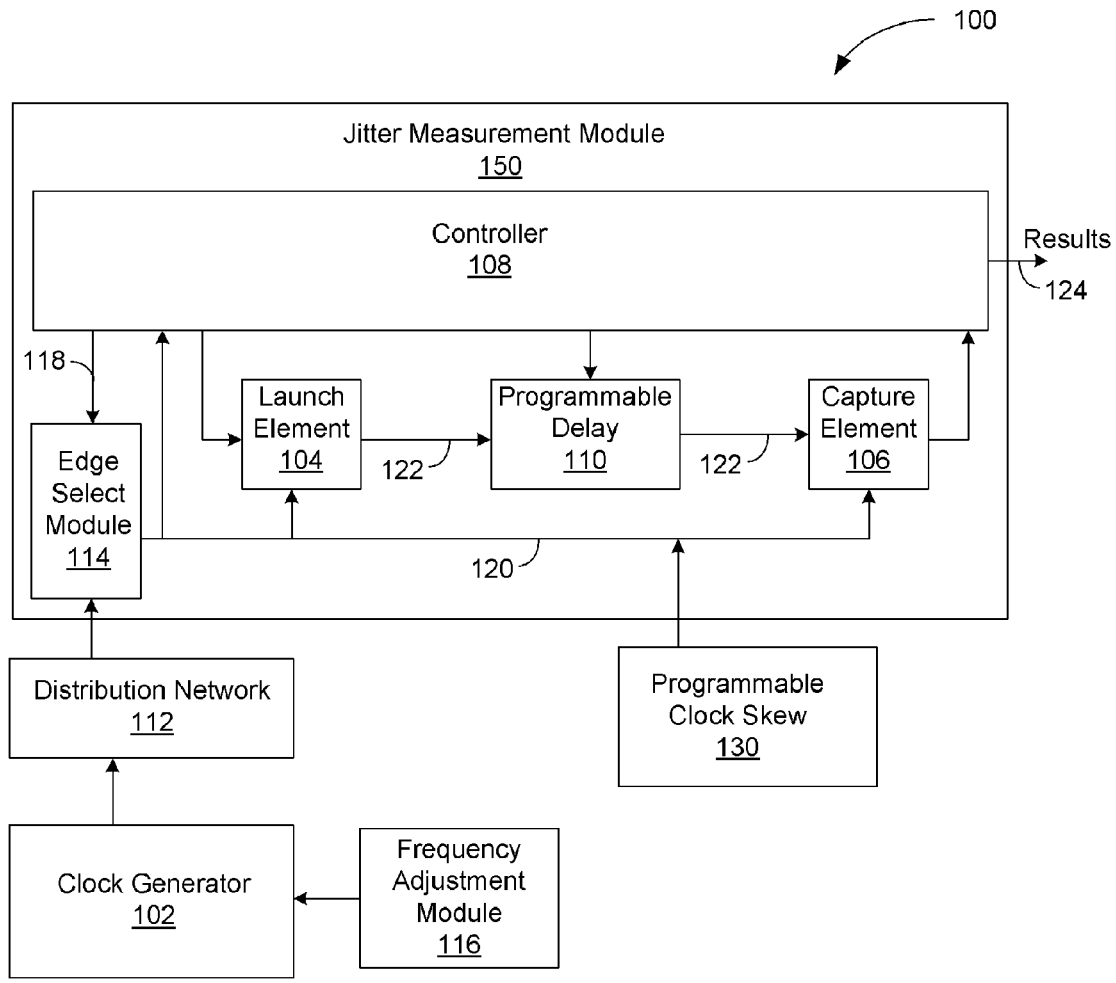
FIG. 1 schematically illustrates a configuration for jitter measurement.

FIG. 1 schematically illustrates a configuration 100 for jitter measurement. The configuration 100 includes a clock generator 102 to generate a timing signal. In one embodiment, the clock generator 102 is a clock of an IC chip. The clock generator 102 can include a variety of types of timing generators. In one embodiment, the clock generator 102 includes a crystal oscillator as a basic clock source. Other clock sources can be used in other embodiments. A phase locked loop (PLL) can be implemented to generate a higher frequency signal from an input reference frequency signal of the crystal oscillator. The output of the PLL can be divided down to lower frequencies. In one embodiment, a clock using the timing signal of the clock generator 102 is distributed to on-chip clock users—e.g., flip-flops or latches—through a distribution network 112 of wires and/or buffers referred to as a clock tree.

The clock generator 102 is coupled to a jitter measurement module 150. In one embodiment, the clock generator 102 is coupled to the jitter measurement module 150 through the distribution network 112. Alternatively, the clock generator 102 can be directly coupled to the jitter measurement module 150 without going through the distribution network 112. The jitter measurement module 150 is configured to measure clock jitter at a location internal to an integrated circuit (IC) chip or along the path of a clock generation and distribution network 112.

In one embodiment, the jitter measurement module 150 is configured to select an edge of the timing signal generated by the clock generator 102. For example, edge select module 114 can be used to select a rising or falling edge of the timing signal as a basis for a clock cycle. The controller 108 can, for example, send a signal 118 to the edge select module 114 to switch between a rising edge detection scheme and a falling edge detection scheme. Any well-known technique to measure a rising or falling edge and/or to select between the rising and the falling edge can be used.

Figure 2:
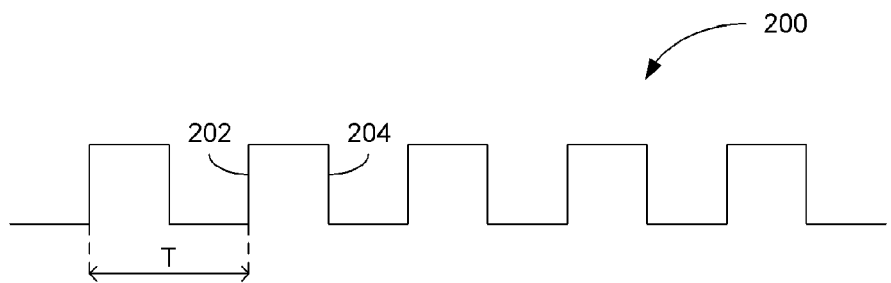
FIG. 2 schematically illustrates a timing signal.

Referring briefly to FIG. 2, an example timing signal 200 having a rising edge 202 and a falling edge 204 is depicted. The timing signal 200 can be generated, for example, by the clock generator 102. The edge select module 114 of FIG. 1 can select the rising edge 202 or the falling edge 204 as a basis for the clock cycle. One clock cycle correlates with one period, T, of the timing signal 200. The period, T, can be measured, for example, as the time between successive rising edges (e.g., rising edge 202) or successive falling edges (e.g., falling edge 204) of the timing signal 200.

Returning again to FIG. 1, the jitter measurement module 150 includes a launch element 104 that is configured to send or launch data through a synchronous data path 122 (including a programmable delay 110) of the timing signal 120 for the clock under test (e.g., clock generator 102). The jitter measurement module 150 further includes a capture element 106 to receive or capture the data sent using the synchronous data path 122. The launch element 104 and the capture element 106 can include flip-flops, data latches, or any other suitable synchronous device. According to one embodiment, the launch element 104 and the capture element 106 are disposed on the IC chip in order to measure clock jitter in situ. The launch element 104 and the capture element 106 can, for example, be fabricated during fabrication of the IC chip.

Jitter measurement error can be reduced in a variety of ways. The metastability window of the capture element 106 should at least be smaller than an expected clock jitter. A smaller metastability window of the capture element 106 provides less measurement error. Power supply noise to the launch element 104 and the capture element 106 can be reduced by use of low inductance power connections and use of on-chip local decoupling capacitance. Crosstalk avoidance techniques can be used in the layout of the IC chip in the area where the launch element 104, the synchronous data path 122, and the capture element 106 are positioned.

The jitter measurement module 150 further includes a controller 108 coupled to the launch element 104 and the capture element 106. The controller 108 is configured to measure on-chip jitter such as cycle-to-cycle or N-cycle jitter (clock uncertainty). In one embodiment, the controller 108 causes the launch element 104 to send data using the synchronous data path 122, and evaluates the data received by the capture element 106. For example, the controller 108 can compare the data received by the capture element 106 with the expected data (e.g., data sent by the launch element 106). If the received data is different than expected, then a timing violation has occurred. The timing violation can include, for example, a hold time violation or a setup time violation. For N-cycle jitter measurements (where N is greater than or equal to 1), a setup time violation is indicated when capture data is different form launch data. In zero-cycle mode, the expected data is opposite the data sent by the launch element. That is, in zero-cycle mode, a hold time violation is indicated by launch and capture data that are the same. The zero-cycle mode launches and captures data from the same clock edge and can be used, for example, to check the measurement error of the jitter measurement module 150.

According to various embodiments, the controller 108 is configured to launch a data transition in the synchronous data path 122, control the number of clock cycles between launch and capture, compare the captured data to the expected data, perform a statistically significant number of launch/capture/compare trials, count the number of times the captured data matches the expected data, and, by repeating these operations while adjusting the timing settings to transition through the range between where timing violations never occur and where timing violations always occur, estimate clock jitter of the timing signal 120 being tested. The controller 108 can be further configured to output the results 124 to a user. Such features of the controller 108 can be implemented in on-chip digital logic to minimize test time. Operations that are not timing-critical can be implemented in a variety of other ways including manual commands, software, firmware, or hardware.

Figure 3:
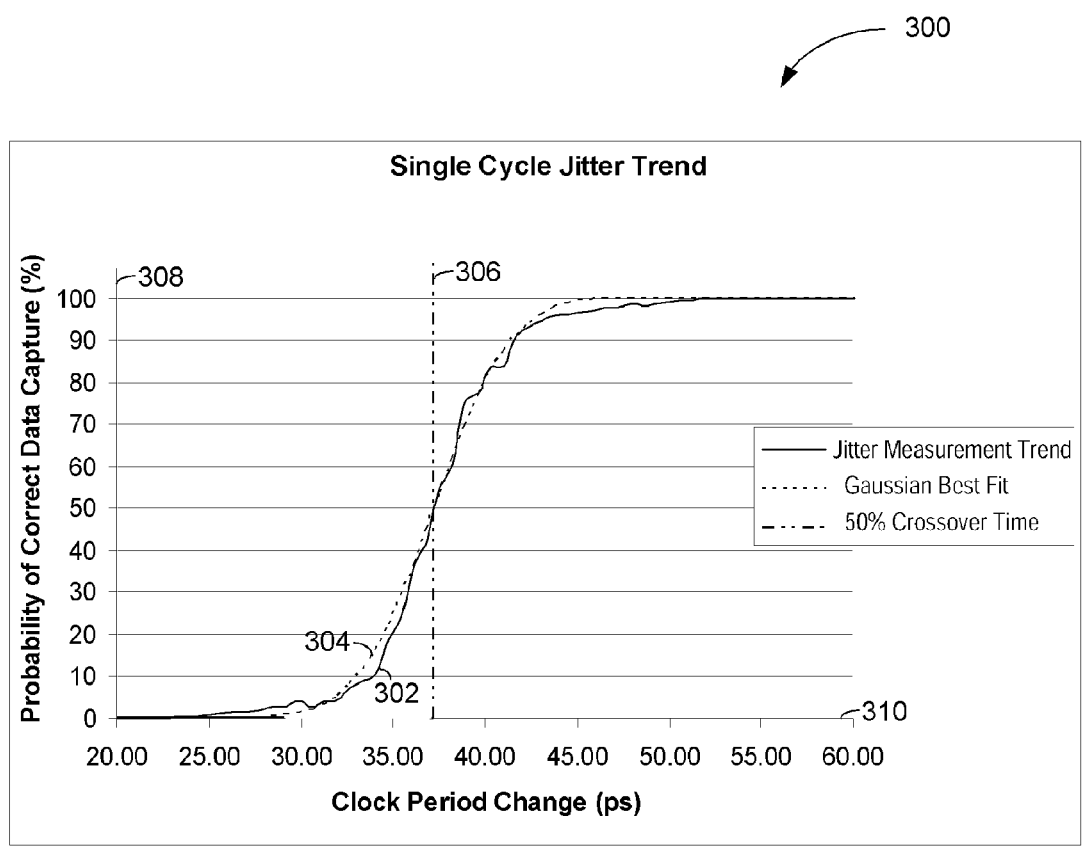
FIG. 3 is an example graph depicting a jitter measurement trend.

The following terms are defined to clarify their use in the present disclosure. A jitter measurement trial is a single launch/capture/compare sequence of data through the synchronous data path 122. The results (e.g., 124) of the jitter measurement trial can include, for example, a comparison of the capture data to the launch data. A jitter measurement test is a statistically significant number of jitter measurement trials performed with the same timing settings (e.g., same clock frequency and/or programmable delay 110). The results (e.g., 124) of the jitter measurement test can include, for example, a number or percentage of trials for which the captured data matches the expected data. A jitter measurement trend includes the results of a number of jitter measurement tests, each performed at a different timing setting (e.g., different clock frequency and/or programmable delay). The results (e.g., 124) of the jitter measurement trend can include the probability of correct data capture for different timing settings. The probability of correct data capture can be plotted against the timing variation to provide a trend as depicted in FIG. 3.

According to various embodiments, the configuration 100 includes means to adjust timing of the synchronous data path 122. The means to adjust the timing can provide a number of different timing settings for the data that is sent and received by the respective launch element 104 and the capture element 106. In general, different timing settings could be achieved by varying the synchronous data path delay between the launch and capture elements, varying the clock skew between the launch and capture elements, or varying the clock frequency setting.

In one embodiment, the means to adjust the timing includes a programmable delay 110 coupled to the synchronous data path 122. The programmable delay 110 can include, for example, a string of cell gates, an analog delay line, or other suitable components. In an embodiment, the controller 108 is aware of the timing signal 120 of the clock generator 102 and is coupled to the programmable delay 110 to adjust the timing of the synchronous data path 122.

In one embodiment, the programmable delay 110 is used for a coarse tuning process that adjusts the programmable delay 110 until the data sent from the launch element 104 is not accurately captured by the capture element 106. For example, the programmable delay 110 can be incrementally adjusted until the timing of the synchronous data path 122 is tuned near a point of a first timing violation. The coarse tuning is used to tune the programmable delay 110 to a timing setting where a fine tuning process can be performed.

In one embodiment, the means to adjust the timing of the synchronous data path 122 includes a frequency adjustment module 116 coupled to adjust the frequency of the clock being tested (e.g., clock generator 102). The frequency adjustment module 116 can further be coupled to the controller 108 such that the controller 108 controls the frequency adjustments. In one embodiment, a controller (not shown) for the frequency adjustment module 116 and the controller 108 are accessible to software or firmware running on a system such as electronic system 500, which is further described in connection with FIG. 5.

The frequency adjustment module 116 can operate in a variety of ways. For example, the clock generator 102 can include a programmable pre-divider, which is a factor called REFDIV in equation (1) below, and a programmable feedback divider, which is a factor called FBDIV in equation (1). The output frequency, f, of the clock generator 102 can be determined according to the following, where Fxtal is a frequency of the crystal oscillator that provides a basic clock source for the clock generator 102:

$$f = Fxtal \cdot \left(\frac{FBDIV}{REFDIV}\right) \quad (1)$$

For a case where the crystal oscillator has a frequency, Fxtal, of 25 megahertz (MHz), and the programmable pre-divider (REFDIV) has a value of 5 and the programmable feedback divider (FBDIV) has a value of 200, the output frequency, f, of the clock generator 102 is 1000 MHz with a period of 1 nanosecond (ns). By adjusting the FBDIV to 199 while keeping the other values of equation (1) the same, the output frequency becomes 995 MHz with a period of about 1.005 ns. Thus, the output frequency, f, can be adjusted in increments of about 5 picoseconds (ps) in this example. The frequency adjustment module 116 can, for example, adjust the frequency of the clock being tested (e.g., clock generator) according to these principles.

In another embodiment, the frequency adjustment module 116 includes a tester that can, for example, be coupled to pins of the IC chip so that the tester can drive the reference clock input of the IC chip and apply high-resolution control of the frequency of the reference clock input, which reference clock input may be an externally-applied signal. The tester of the frequency adjustment module 116 can access the controller 108 to set up the measurements and read back the results. Other suitable techniques to adjust the frequency of the clock generator 102 can be implemented in other embodiments.

In another embodiment, programmable clock skew 130 is used to adjust the timing of the timing signal 120. The programmable clock skew 130 can be used to vary the clock skew between the launch element 104 and the capture element 106. The controller 108 may be used to control the clock skew adjustments of the programmable clock skew 130.

The frequency adjustment module 116, or the programmable delay 110, or combinations thereof, can be used to adjust timing of the synchronous data path 122 for jitter measurement. In one embodiment, the frequency adjustment module 116 or the programmable delay 110 are used to provide a number of different timing settings for a fine tuning process. The fine tuning process includes incrementally adjusting the timing of the synchronous data path 122 such that the timing passes through a first timing setting that results in a condition where a timing violation occurs for each of a statistically significant number of jitter measurement trials to a second timing setting that results in a condition where the timing violation does not occur for any of the statistically significant number of jitter measurement trials. In one embodiment, the result of the fine-tuning process is a jitter measurement trend, which is described further in connection with FIG. 3.

According to various embodiments, the controller 108 can be further configured to auto-range the programmable delay 110 so that the timing for the synchronous data path 122 is at a threshold of setup timing violations. The controller 108 can be further configured to auto-calibrate the programmable delay 110 so that the number of delay increments per clock period is known. The controller 108 can be further configured to control whether the synchronous launch and capture occur on the rising edge of the clock or on the falling edge of the clock (e.g., using edge select module 114) so that jitter can be measured on either edge. The controller 108 can be further configured to automate the incremental sweep of timing settings across multiple jitter measurement tests via adjustments to the programmable delay 110 or the clock frequency through the frequency adjustment module 116. The controller 108 can be further configured to automate the compilation and formatting of results from multiple jitter measurement tests performed while incrementally sweeping the timing settings of the synchronous data path 122 to provide a jitter measurement trend. Still further, the controller 108 can be configured to automate the comparison of the jitter measurement trend to various statistical models such as a Gaussian distribution.

The functionality described with respect to the edge select module 114, the frequency adjustment module 115, the controller 108, and the jitter measurement module can be achieved via separate components or a combination of components in a variety of ways including being combined into a single application according to various embodiments. For example, the described modules (e.g., 114, 116, 150) and controller (e.g., 108) may refer to, be part of, or include an Application Specific Integrated Circuit (ASIC), an electronic circuit, a processor (shared, dedicated, or group) and/or memory (shared, dedicated, or group) that execute one or more software or firmware programs, a combinational and/or sequential logic circuit, and/or other suitable components that provide the described functionality.

FIG. 3 depicts an example graph 300 of a jitter measurement trend 302 that includes a probability of correct data capture (%) on a vertical axis 308 for incremental changes to clock period (ps) on a horizontal axis 310. The probability of correct data capture can be measured and calculated by the controller 108 of FIG. 1 and the incremental changes to the clock period can be performed by any suitable means for adjusting timing of the synchronous data path 122 of FIG. 1 as described herein.

The example graph 300 represents test results (e.g., 124 of FIG. 1) that can be provided by the jitter measurement module 150 of FIG. 1. In the depicted graph, the horizontal axis 310 provides a mean clock period change from a starting mean clock period of approximately 1702.1 ps, which corresponds to a frequency of approximately 588 MHz. The data was collected by increasing the clock period in increments of about 0.7 ps and performing a statistically significant number of jitter measurement trials at each different timing setting. In this example, 4095 trials were run for each jitter measurement test.

The Gaussian best fit 304 is a Gaussian distribution with an average value of 37.2 ps and a standard deviation of 3.25 ps. As depicted, the jitter measurement trend 302 follows the Gaussian Best Fit 304 closely. The 50% crossover time 306 occurs at a clock period of 1739.3 ps, corresponding with a clock period change of 37.2 ps (e.g., 1702.1 ps+37.2 ps). At the 50% crossover time, the probability of correct data capture on the vertical axis 308 is 50%.

The last point at which no trials resulted in correct data capture (e.g., the probability of correct data capture is 0%) occurred at a clock period change of 20.0 ps. The first point at which 100% of the trials resulted in correct data capture occurred at a clock period increase of 56.7 ps. The resulting timing range from the point where timing is met nearly 100% of the time to the point where timing is violated nearly 100% of the time corresponds to the jitter of the clock. Thus, if the clock in test had no jitter (and an error free measurement could be made), the jitter measurement trend 302 would be a vertical line at a clock period change of about 37.2 ps. The shape of the jitter measurement trend 302 over this range of timing settings can provide insight regarding the jitter distribution. For example, a bi-modal distribution could indicate a type of circuit design error.

Jitter can cause the actual clock period at the clock endpoint to vary from its average value. In the example graph 300, when the clock period is increased to a clock period change of 56.7 ps (e.g., mean clock period of 1758.8 ps), the actual clock period always stays on the right side of the 50% crossover time at 37.2 ps. Thus, jitter and any measurement error can cause the clock period to decrease by as much as 19.5 ps from one clock cycle to the next in this example graph 300 of a single cycle jitter trend. At a mean clock period change of 20 ps (e.g., mean clock period of 1702.1 ps), the actual clock period always stays on the left side of the 50% crossover time at 37.2 ps. Thus, jitter and any measurement error can cause the clock period to increase by as much as 17.2 ps from one clock cycle to the next. Another way of stating this is that the measured cycle-to-cycle jitter or clock uncertainty is +17.2 ps and −19.5 ps.

The controller 108 of FIG. 1 can be configured to determine clock jitter and output the results (e.g., 124) according to the principles described herein. The specific values used to describe the example graph 300 are merely example values and a variety of other suitable values can be used in other embodiments.

Cycle-to-cycle jitter measurements in the range of about +/−7 ps can be obtained using techniques disclosed herein with measurement error in the range of about 3 ps, which may be considerably less than off-chip measurement techniques. The reduced measurement error for the disclosed on-chip technique can allow an operating frequency to be increased for a chip.

For example, suppose that an IC chip that is targeted to run at a maximum clock frequency of 2 gigahertz (GHz) has a measured on-chip jitter of 20 ps using techniques disclosed herein and has a measured off-chip jitter of 60 ps using other well-known techniques. If the clock of the IC chip has no jitter at all, the IC chip could have a maximum operating frequency of 2 GHz. If the clock has jitter based on the 20 ps on-chip measurement, then the IC chip can have a maximum operating frequency of 1.923 GHz. If the clock has jitter based on the 60 ps on-chip measurement, then the IC chip can have a maximum operating frequency of 1.786 GHz. Thus, the improved accuracy of the on-chip jitter measurement, as disclosed herein, allows the maximum operating frequency to be increased by nearly 8% in this example, facilitating an increase in performance for the IC chip.

The clock frequency of the tested clock can be set to a maximum operating frequency that accounts for statistical probability of a timing violation. For example, a six-sigma operating frequency can be implemented where sigma represents a standard deviation of a Gaussian best fit (e.g., 304) of the jitter measurement trend (e.g., 302). According to various embodiments, the on-chip jitter measurement can be used for dynamic performance tuning of the IC chip.

Figure 4:
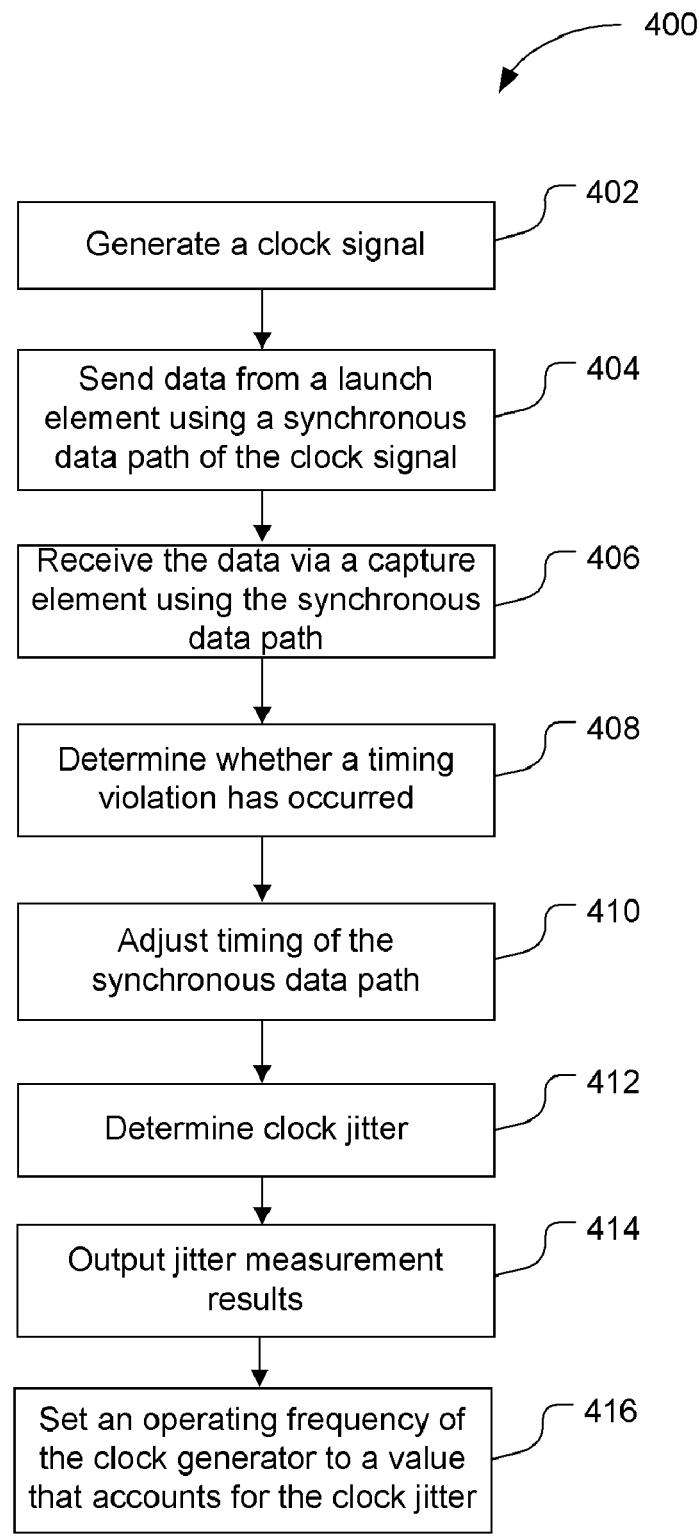
FIG. 4 is a flow diagram of a method for measuring clock jitter.

FIG. 4 is a flow diagram of a method for measuring clock jitter. The method 400 includes generating a clock signal at block 402. The clock signal can be generated by a clock generator of an IC chip. The clock generator can be on the chip or off the chip. The timing signal can be a digital signal having a rising and falling edge as described herein or any other suitable signal.

At block 404, the method 400 includes sending data from a launch element using a synchronous data path of the clock signal. At block 406, the method 400 includes receiving the data via a capture element using the synchronous data path. In an embodiment, the launch and capture elements and the synchronous data path are disposed on the IC chip using the clock generator that generates the clock signal at block 402.

At block 408, the method 400 includes determining whether a timing violation has occurred. The timing violation can be determined by comparing the data sent from the launch element with the data received by the capture element. If the data is different, then a timing violation has occurred. Operations at blocks 404, 406, 408 can be performed once as part of a jitter measurement trial or multiple times as part of a jitter measurement test as described herein. After block 408, the method 400 may include a decision to determine whether a desired number of trials have been performed (e.g., a statistically significant number of trials. If not, operations 404, 406, and 408 are performed again until the desired number of trials have been performed.

At block 410, the method 400 includes adjusting timing of the synchronous data path. The timing can be adjusted to provide a number of different timing settings. The actions of sending, receiving, and determining at blocks 404, 406, and 408 can be performed a statistically significant number of times for each of the different timing settings to provide a jitter measurement trend as described herein. After block 410, the method 400 may include another decision to determine whether a range of timing settings include a timing setting where 0% timing violations result for the desired number of trials to another timing setting where 100% timing violations result for the desired number of trials. If the desired range of timing settings has not yet been spanned, then the method returns to block 404 to repeat operations 404, 406, and 408 for a new timing setting until the desired range of timing settings has been spanned.

The timing of the synchronous data path can be adjusted in a coarse tuning process that performs a jitter measurement trial or test at a number of different timing settings for the synchronous data path to identify a timing setting that is at or near a first setup timing violation. The timing of the synchronous data path can also be adjusted in a fine tuning process to provide a range of the different timing settings that includes a first timing setting that results in a condition where the timing violation occurs for each of the statistically significant number of times to a second timing setting that results in a condition where the timing violation does not occur for any of the statistically significant number of times. In one embodiment, the timing of the synchronous data path is incrementally adjusted.

The adjustment of the timing of the synchronous data path at block 410 can be performed in a variety of ways. In one embodiment, a programmable delay is used to adjust the timing. The programmable delay can, for example, be coupled to the synchronous data path. In another embodiment, the timing is adjusted by changing a clock frequency of the clock generator. For example, a PLL can be reprogrammed to change the output frequency or an input frequency delivered to the PLL can be adjusted to change the output frequency.

At block 412, the method 400 includes determining clock jitter. Clock jitter corresponds with a time difference between the first timing setting and the second timing setting described above. A jitter measurement trend can be performed to determine clock jitter as described herein.

At block 414, the method 400 includes outputting the jitter measurement results. The output can be in a variety of formats including data such as numbers, values, graphs, statistical models or other suitable output.

At block 416, the method 400 includes setting an operating frequency of the clock generator to a value that accounts for the clock jitter. For example, the clock jitter provides information about the variation and uncertainty of clock arrival times. As a clock frequency increases, the percentage of data successfully captured by the capture element decreases. Thus, the frequency of the measured clock can be set to an operating value that accounts for the tradeoff between increasing performance speed (e.g., higher frequency) and decreasing the likelihood of a timing error (e.g., lower frequency).

Figure 5:
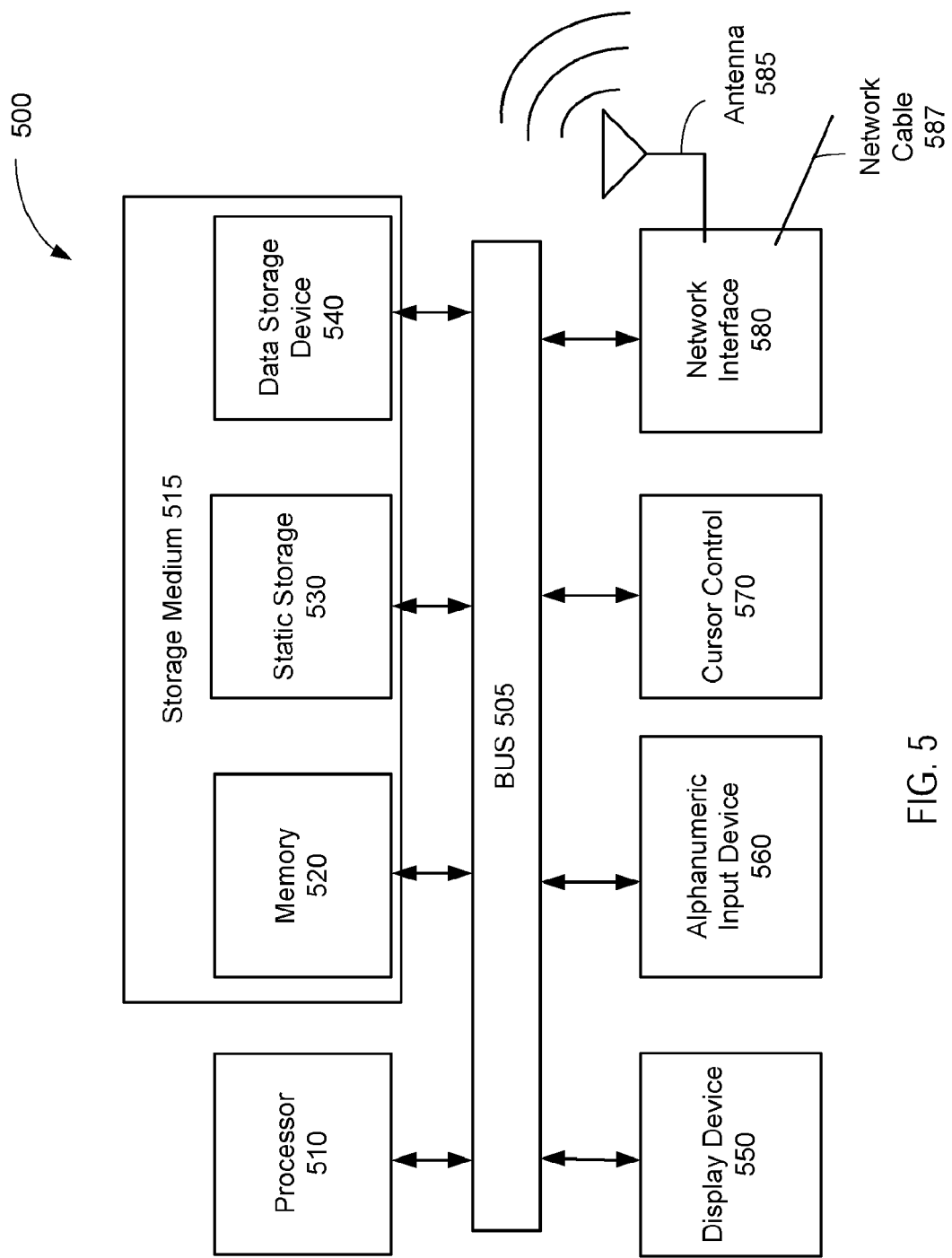
FIG. 5 is a schematic diagram of an electronic system that can be used to implement embodiments described herein.

FIG. 5 is a schematic diagram of an electronic system 500 that can be used to implement embodiments described herein. The electronic system 500 is intended to represent a range of electronic devices (either wired or wireless). According to various embodiments, the electronic system 500 represents a variety of devices including, for example, desktop computer devices, laptop computer devices, personal computers (PC), telephones, personal digital assistants (PDA) including cellular-enabled PDAs, set top boxes, pocket PCs, tablet PCs, DVD players, video players, televisions, printers, or servers, but is not limited to these examples and can include other electronic devices. Alternative electronic systems can include more, fewer and/or different components.

The electronic system 500 includes an IC chip as described herein. The IC chip can, for example, refer to, be part of, or include at least the processor 510 and/or memory 520 components of the electronic system. Subject matter is not limited in this regard and the IC chip can refer to, be part of, or include other components of the electronic system 500. In one embodiment, the processor 510 and/or the memory 520 comprises an IC chip having at least a launch element (e.g., 104), a synchronous data path (e.g., 122), and a capture element (e.g., 106) disposed thereon.

The electronic system 500 includes a bus 505 or other communication device or interface to communicate information, and the processor 510 coupled to the bus 505 to process information. Bus 505 can be a single system bus or a number of buses of the same or different types bridged together. The electronic system 500 can include one or more processors 510 and/or co-processors.

The electronic system 500 includes a storage medium 515, which can include a variety of types of storage, coupled to the bus 505 to store information and/or instructions that can be processed and/or executed by the processor 500. The storage medium can include, for example, memory 520, static storage 530, and/or data storage device 540. The storage medium 515 can include more or less types of storage than depicted according to various embodiments.

An article of manufacture is disclosed. In one embodiment, the article of manufacture has computer-readable instructions stored thereon, that if executed, result in the actions described herein. The actions can be associated, for example, with functions of one or more described modules and/or controllers. In an embodiment, instructions to implement or perform actions described herein are stored in the storage medium 515 or other computer-readable medium and are executed by the processor 510. The instructions can be in the form of firmware or software according to various embodiments.

In an embodiment, the system 500 includes random access memory (RAM) or other storage device 520 (may be referred to as "memory"), coupled to the bus 505. The memory 520 can also be used to store temporary variables or other intermediate information during execution of instructions by the processor 510. The memory 520 comprises a flash memory device in one embodiment.

According to various embodiments, the system 500 also includes read only memory (ROM) and/or other static storage device 530 coupled to the bus 505 to store static information and instructions for the processor 510. A data storage device 540 can be coupled to the bus 505 to store information and instructions. The data storage device 540 can, for example, include a magnetic hard disk drive (HDD).

The electronic system 500 can also be coupled via the bus 500 to a display device 550, such as a cathode ray tube (CRT), plasma, or liquid crystal display (LCD), to display information to a user. In an embodiment, the display device 550 is coupled with the processor 510 to display output results (e.g., 124) for a jitter measurement trial, test, or trend, as described herein. Alphanumeric input device 560, including alphanumeric and other keys, can be coupled to the bus 505 to communicate information and command selections to the processor 510. Cursor control 570 is a type of input device and can include, for example, a mouse, a trackball, or cursor direction keys to communicate information and command selections to the processor 510 and to control cursor movement on the display device 550.

The electronic system 500 can further include one or more network interfaces 580 to provide access to network 520, such as a local area network, but is not limited in this regard. The network interface(s) 580 can include, for example, a wireless network interface having antenna 585, which can represent one or more antennae. Network interface 580 can also include, for example, a wired network interface to communicate with remote devices via network cable 587, which can be, for example, an Ethernet cable, a coaxial cable, a fiber optic cable, a serial cable, or a parallel cable.

In one embodiment, the network interface 580 can provide access to a local area network, for example, by conforming to an Institute of Electrical and Electronics Engineers (IEEE) standard such as IEEE 802.11b and/or IEEE 802.11g standards, and/or the wireless network interface can provide access to a personal area network, for example, by conforming to Bluetooth standards. Other wireless network interfaces and/or protocols can also be supported.

IEEE 802.11b corresponds to IEEE Std. 802.11b-1999 entitled "Local and Metropolitan Area Networks, Part 11: Wireless LAN Medium Access Control (MAC) and Physical Layer (PHY) Specifications: Higher-Speed Physical Layer Extension in the 2.4 GHz Band," approved Sep. 16, 1999 as well as related documents. IEEE 802.11g corresponds to IEEE Std. 802.11g-2003 entitled "Local and Metropolitan Area Networks, Part 11: Wireless LAN Medium Access Control (MAC) and Physical Layer (PHY) Specifications, Amendment 4: Further Higher Rate Extension in the 2.4 GHz Band," approved Jun. 27, 2003 as well as related documents. Bluetooth protocols are described in "Specification of the Bluetooth System: Core, Version 1.1," published Feb. 22, 2001 by the Bluetooth Special Interest Group, Inc. Previous or subsequent versions of the Bluetooth standard can also be supported.

Although certain embodiments have been illustrated and described herein for purposes of description of the preferred embodiment, a wide variety of alternate and/or equivalent embodiments or implementations calculated to achieve the same purposes may be substituted for the embodiments illustrated and described without departing from the scope of the present invention. Embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. A method comprising:
   sending data from a launch element using a synchronous data path of a timing signal;
   receiving the data at a capture element using the synchronous data path, wherein the launch element and the capture element are disposed on an integrated circuit chip; and
   determining, by a controller, whether a timing violation has occurred due to jitter associated with the timing signal by comparing the sent data with the received data.

2. The method of claim 1, further comprising:
   adjusting timing of the synchronous data path to provide a number of different timing settings, wherein each of (i) sending the data, (ii) receiving the data, and (iii) determining whether a timing violation has occurred are performed multiple times for each of the different timing settings.

3. The method of claim 2, wherein adjusting the timing of the synchronous data path provides a range of the different timing settings, the different timing settings spanning a range that includes:
   a first timing setting that results in a condition where the timing violation occurs for each of the multiple times, to
   a second timing setting that results in a condition where the timing violation does not occur for any of the multiple times.

4. The method of claim 3, further comprising:
   determining the jitter associated with the timing signal to correspond with a time difference between the first timing setting and the second timing setting.

5. The method of claim 4, further comprising:
   setting a frequency of the timing signal to a value that accounts for the clock jitter.

6. The method of claim 2, wherein adjusting the timing of the synchronous data path is performed by incrementally adjusting a frequency of the timing signal.

7. The method of claim 2, wherein adjusting the timing of the synchronous data path is performed by adjusting a programmable delay coupled to the synchronous data path.

8. The method of claim 1, wherein determining whether the timing violation has occurred results in a determination that the timing violation has occurred if the received data is different from the sent data.

9. An apparatus comprising:
   a launch element to send data in accordance with a timing signal, the data being sent through a synchronous data path;
   a capture element coupled to receive the data sent by the launch element, wherein the launch element and the capture element are disposed on an integrated circuit chip;
   a programmable delay to adjust timing of the synchronous data path to provide a number of different timing settings for the data that is respectively sent and received by the launch element and the capture element; and
   a controller to
      cause the launch element to send the data through the synchronous data path, and
      determine whether a timing violation has occurred due to jitter associated with the timing signal by comparing the data received by the capture element with the data sent by the launch element for each of the number of different timing settings.

10. The apparatus of claim 9, wherein the controller is configured to adjust the programmable delay.

11. The apparatus of claim 9, further comprising:
   a clock generator to generate the timing signal; and
   a frequency adjustment module coupled to the clock generator, the frequency adjustment module to adjust a clock frequency of the clock generator.

12. The apparatus of claim 11, wherein the clock generator is disposed on the integrated circuit.

13. The apparatus of claim 12, wherein the clock generator comprises a phase locked loop (PLL).

14. The apparatus of claim 9, wherein the controller is configured to cause the launch element to send the data and to compare the data received by the capture element with the data sent by the launch element multiple times for each of the number of different timing settings.

15. The apparatus of claim 14, wherein the number of different timing settings spans a range including:
   a first timing setting that results in a condition where the timing violation occurs for each of the multiple times; to a second timing setting that results in a condition where the timing violation does not occur for any of the multiple times.

16. The apparatus of claim 15, wherein the controller is configured to determine the jitter associated with the timing signal to correspond with a time difference between the first timing setting and the second timing setting.

17. The apparatus of claim 9, wherein the launch element comprises a flip-flop or a data latch; and wherein the capture element comprises a flip-flop or a data latch.

18. The apparatus of claim 9, wherein the controller is configured to control a number of clock cycles of the timing signal that occur between sending the data by the launch element and receiving the data by the capture element.

19. The apparatus of claim 9, wherein the timing violation comprises a setup time violation.

20. The apparatus of claim 9, wherein the controller further comprises functionality to select a rising edge or a falling edge of the timing signal as a basis for a clock cycle.

* * * * *